(12) United States Patent
Han

(10) Patent No.: US 12,107,577 B2
(45) Date of Patent: Oct. 1, 2024

(54) CURRENT MODE LOGIC CIRCUIT

(71) Applicant: Industry-University Cooperation Foundation Hanyang University, Seoul (KR)

(72) Inventor: Jae Duk Han, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 115 days.

(21) Appl. No.: 17/802,555

(22) PCT Filed: Dec. 9, 2020

(86) PCT No.: PCT/KR2020/017832
§ 371 (c)(1),
(2) Date: Aug. 26, 2022

(87) PCT Pub. No.: WO2021/172712
PCT Pub. Date: Sep. 2, 2021

(65) Prior Publication Data
US 2023/0143218 A1 May 11, 2023

(30) Foreign Application Priority Data
Feb. 28, 2020 (KR) .................. 10-2020-0025372

(51) Int. Cl.
*H03K 19/0185* (2006.01)
*H03K 19/003* (2006.01)
*H03K 19/017* (2006.01)

(52) U.S. Cl.
CPC . *H03K 19/01735* (2013.01); *H03K 19/00361* (2013.01); *H03K 19/00384* (2013.01)

(58) Field of Classification Search
CPC ....... H03K 19/00361; H03K 19/00384; H03K 19/01735
See application file for complete search history.

(56) References Cited

U.S. PATENT DOCUMENTS

| 10,924,013 B1* | 2/2021 | Laur ...................... H02M 1/15 |
| 2016/0173098 A1* | 6/2016 | Jaffari ............ H03K 19/018528 |
| | | 326/83 |

FOREIGN PATENT DOCUMENTS

| KR | 10-2007-0034177 A | 3/2007 |
| KR | 10-2008-0053165 A | 6/2008 |

OTHER PUBLICATIONS

International Search Report for PCT/KR2020/017832 dated Mar. 12, 2021 (PCT/ISA/210).

* cited by examiner

Primary Examiner — Kurtis R Bahr
(74) *Attorney, Agent, or Firm* — Sughrue Mion, PLLC

(57) ABSTRACT

According to an aspect, a current mode logic circuit comprise a first transistor to which an input voltage is applied, a second transistor connected in parallel with the first transistor; and a voltage sampling circuit which is connected to the first transistor and the second transistor and resets an output voltage output by integrating the input voltage for a predetermined set time (T) in a manner in which the output voltage is integrated in a direction opposite to a direction in which the input voltage is integrated for the predetermined set time (T).

11 Claims, 16 Drawing Sheets

10

(a)

(b)

(a)

(b)

(a)

(c)

(b)

(a)

(b)

(c)

(a)

(b)

(c)

(d)

CURRENT MODE LOGIC CIRCUIT

CROSS REFERENCE TO RELATED APPLICATION

This application is a National Stage of International Application No. PCT/KR2020/017832 filed Dec. 9, 2020, claiming priority based on Korean Patent Application No. 10-2020-0025372 filed on Feb. 28, 2020 in the Korean Intellectual Property Office, the disclosure of which is incorporated herein by reference.

BACKGROUND

A current mode logic circuit is a kind of semiconductor logic device, and refers to an unsaturated high-speed logic circuit constructed using differentially connected current switches.

High-speed operation signal processing circuits are realized using a technique called current mode logic (CML), and are generally configured in the form of using a resistance device as a load in a differential amplifier, and thus, have the advantage of being able to achieve a higher operating speed than the CMOS (complementary metal-oxide semiconductor) method in which NMOS (n-channel metal oxide semiconductor) or PMOS (N-channel metal oxide semiconductor) devices are connected in pairs.

In addition, the current mode logic circuit has an advantage in terms of noise as well because it can be transmitted as a differential signal. Therefore, the current mode logic is used for most of the integrated circuits of gigahertz bands constituting a device requiring a high-speed operation to support a 10 Gbps class GPON (gigabit-capable passive optical network).

The current mode logic circuit 10 according to the prior art is configured to include an output terminal load resistor R1 and a load capacitance C1 as shown in FIG. 1. However, in this current mode logic circuit, when a step voltage is applied as an input voltage as shown in FIG. 1, as shown in FIG. 2, the maximum speed (Vout) of the output voltage is determined by the time constant of the RC circuit. There was a problem to be decided.

SUMMARY OF THE DISCLOSURE

Technical Objects

Accordingly, the current mode logic circuit according to an embodiment is an invention devised to solve the above-described problems, and an object of the present invention is to provide a current mode logic circuit in which the time constant problem of the RC circuit generated in the current mode logic circuit is solved.

Another object of the present invention is to provide a circuit having a higher output speed while implementing a current mode logic circuit using a semiconductor device having a size smaller than that of a circuit according to the prior art.

According to an aspect, a current mode logic circuit comprise a first transistor to which an input voltage is applied, a second transistor connected in parallel with the first transistor; and a voltage sampling circuit which is connected to the first transistor and the second transistor and resets an output voltage output by integrating the input voltage for a predetermined set time (T) in a manner in which the output voltage is integrated in a direction opposite to a direction in which the input voltage is integrated for the predetermined set time (T).

The voltage sampling circuit may include a first switch, a second switch, a first capacitor, and a second capacitor and the first switch is connected to one end of the second transistor, the second switch is connected to the other end of the second transistor and the second capacitor is disposed between the first switch and the second switch.

The voltage sampling circuit individually may control the first switch and the second switch to be turned on or off so that, for an output form of the output voltage, a section in which the input voltage is integrated and output and a section in which the output voltage is reset are alternated at a certain period.

The output voltage may be a voltage integrated by the input voltage, when the first switch is turned on and the second switch is turned off and the output voltage may be a voltage generated in a process of resetting the output voltage output by integrating the input voltage when the first switch is turned off and the second switch is turned on.

The voltage sampling circuit may control individually the first switch and the second switch to be turned on or off so that a length of the section in which the input voltage is integrated and output as the output voltage is the same as a length of the section in which the output voltage is reset.

The voltage sampling circuit may control individually the first switch and the second switch to be turned on or off so that a length of the section in which the input voltage is integrated and output as the output voltage is different from a length of the section in which the output voltage is reset.

The voltage sampling circuit individually may control the first switch and the second switch to be turned on or off so that a length of the section in which the input voltage is integrated and output as the output voltage is different from a length of the section in which the output voltage is resct.

The voltage sampling circuit may control the predetermined set time (T) so that a product of a transconductance (GM2) of the second transistor and the predetermined set time (T) is the same as a capacitance (C1) of the first capacitor.

The current mode logic circuit may further comprise a buffer connected to the first switch to amplify an output voltage of the current mode logic circuit.

According to another aspect, a current mode logic circuit may comprise an integrating circuit which includes a first transistor to which an input voltage is applied and a first capacitor connected in parallel with the first transistor and integrates the input voltage for a predetermined set time to output an output voltage and a self-compensation circuit which resets the output voltage output by the integrating circuit in a manner in which the input voltage is integrated in a direction opposite to a direction in which the input voltage is integrated for the predetermined set time in the integrating circuit.

The self-compensation circuit may include a voltage sampling circuit and a second transistor and the predetermined set time (T) is controlled so that a product of a transconductance (GM2) of the second transistor and the predetermined set time is the same as a capacitance (C1) of the first capacitor.

The integrating circuit may include a third transistor and a fourth transistor, the self-compensation circuit includes a clock comparator, the output voltage of the integrating circuit is input as an input voltage of the clock comparator and an output voltage of the clock comparator is applied to the third transistor and the fourth transistor.

The integrating circuit may include a third transistor and a fourth transistor and the self-compensation circuit includes a fifth transistor and a sixth transistor connected in series, a seventh transistor and an eighth transistor connected in series, a third capacitor connected between the fifth transistor and the sixth transistor, and a fourth capacitor connected between the seventh transistor and the eighth transistor.

The output voltage of the integrating circuit may be input to the fifth transistor and the seventh transistor and an output voltage of the self-compensation circuit may be input to the third transistor and the fourth transistor.

According to others aspect, a current mode logic circuit may comprise an integrating circuit which includes a reset circuit configured to reset an output voltage, a first transistor to which an input voltage is applied, and a first capacitor connected in parallel with the first transistor and integrates the input voltage for a predetermined set time to output the output voltage and a self-compensation circuit which may include a plurality of transistors and a clock comparator and reset the output voltage output by the integrating circuit by integrating the output voltage in a direction opposite to a direction in which the input voltage is integrated for the predetermined set time in the integrating circuit.

Effects of the Invention

The current mode logic circuit according to an embodiment does not implement the reset operation using a switch, but implements the reset operation by integrating in a direction opposite to the integration signal in the reset period. Accordingly, the present invention has the advantage of solving the time constant problem of the RC circuit related to the reset operation of the conventional current mode logic circuit.

In addition, the present invention does not require a separate reset circuit for resetting the circuit, so that an increase in parasitic capacitance caused by the reset circuit can be minimized. Accordingly, the present invention has the advantage of having a faster operation speed with a smaller size than the current mode logic circuit according to the prior art.

DETAILED DESCRIPTION OF THE PREFERRED EMBODIMENTS

Figure 1:
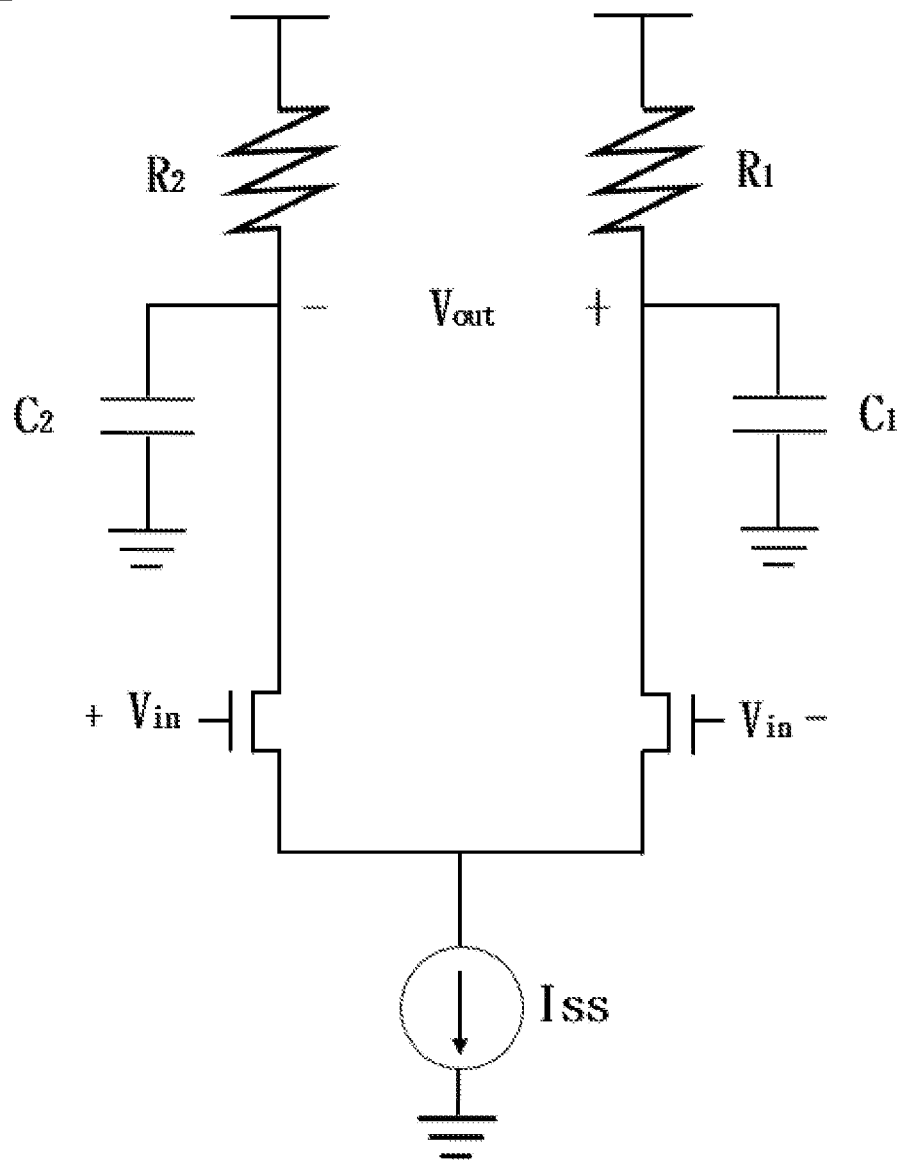
FIG. 1 is a diagram showing a circuit diagram of a current mode logic circuit according to the prior art.
Figure 2:
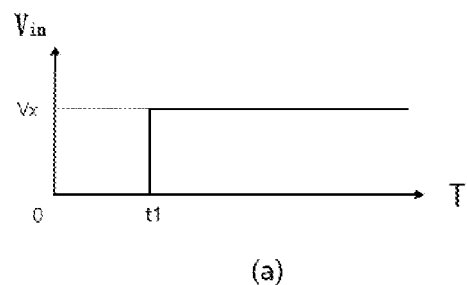
FIG. 2 is a diagram illustrating magnitudes of an input voltage and an output voltage of the current mode logic circuit according to FIG. 1.
Figure 2:
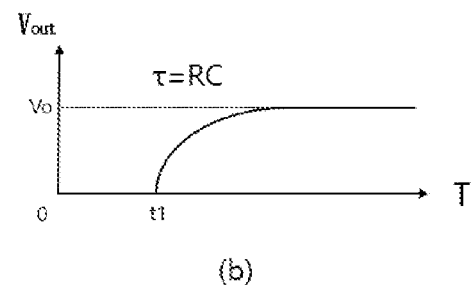

Hereinafter, embodiments according to the present invention will be described with reference to the accompanying drawings. In adding reference numerals to constituent elements of each drawing, it should be noted that the same constituent elements are denoted by the same reference numeral even if they are illustrated on different drawings. In describing the embodiments of the present invention, a detailed description of pertinent known constructions or functions will be omitted if it is deemed to make the gist of the embodiments the present invention unnecessarily vague. In addition, the embodiments of the present invention will be described below, but the technical idea of the present invention is not limited thereto or is not restricted thereto, and may be variously realized by being modified by those skilled in the art.

In addition, terms used in the present specification are used only in order to describe embodiments rather than limiting or restricting the present invention. Singular forms are intended to include plural forms unless the context clearly indicates otherwise.

In the present specification, it should be understood that the term "include", "comprise", or "have" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

In addition, throughout the specification, when it is described that an element is "connected" to another element, this includes not only being "directly connected", but also being "indirectly connected" with another element in between, and terms including ordinal numbers such as first, second, and the like used in the present specification will be used only to describe various elements, and are not to be interpreted as limiting these elements.

The present invention will be described more fully hereinafter with reference to the accompanying drawings, in which embodiments of the invention are shown. In the drawings, parts irrelevant to the description are omitted in order to clearly describe the present invention.

Furthermore, the title of the invention is a method and apparatus for providing a document editing interface for providing resource information related to a document using a backlink button. For convenience of explanation, however, in the specification below, an apparatus for providing a document editing interface for providing resource information associated with a document using a backlink button is referred to as a document editing interface providing apparatus in its description. The meaning of 'clicking' throughout the document is used to refer to the user requesting an execution command for the button, and as a common term, it may refer to executing a command by clicking a mouse or using a specific key on a keyboard in a PC environment, and tapping by a user's touch consecutively or for a certain period of time in a mobile environment.

Figure 3:
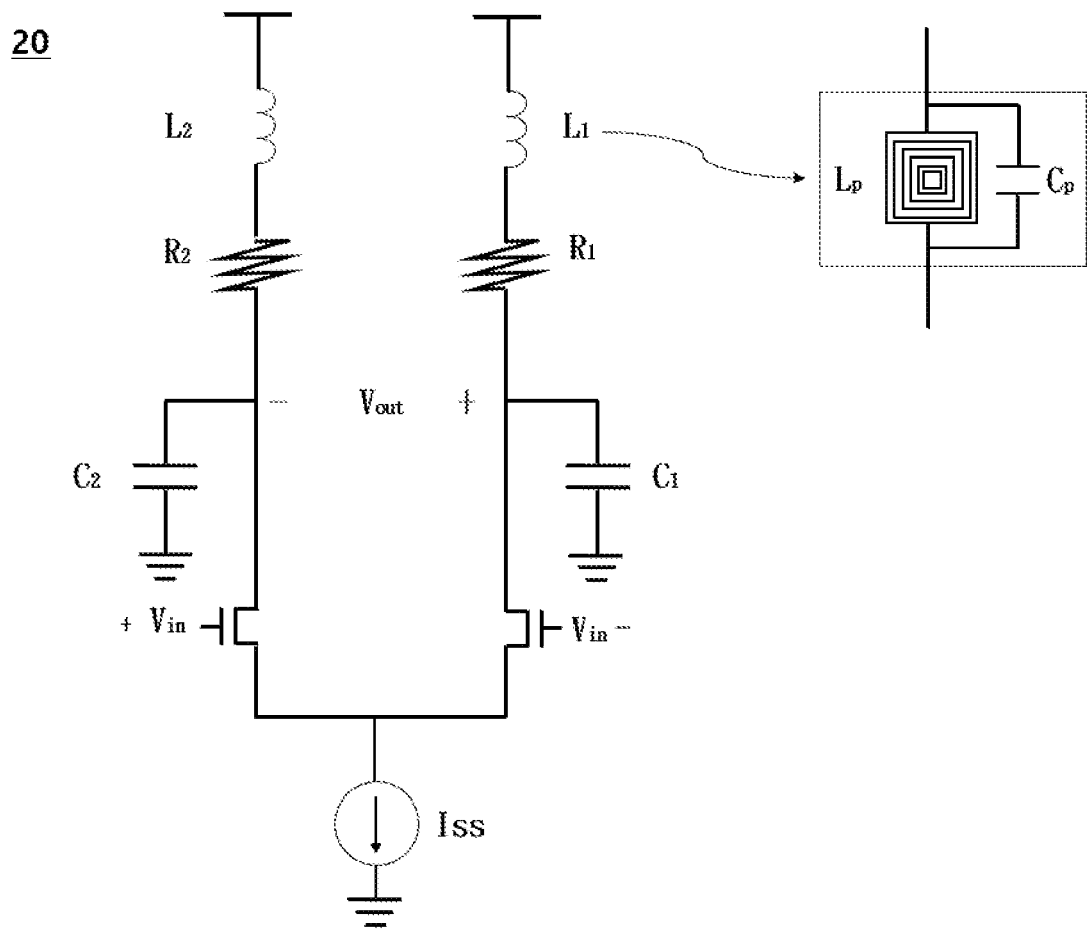
FIG. 3 is a diagram illustrating a circuit diagram of a current mode logic circuit according to the prior art.
Figure 4:
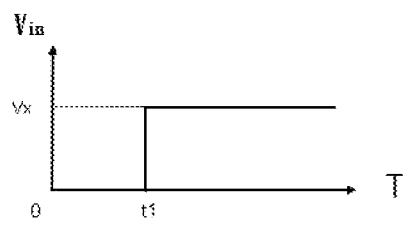
FIG. 4 is a diagram illustrating magnitudes of an input voltage and an output voltage of the current mode logic circuit according to FIG. 3
Figure 4:
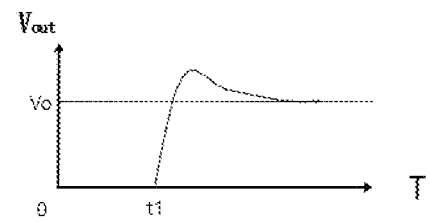
Figure 5:
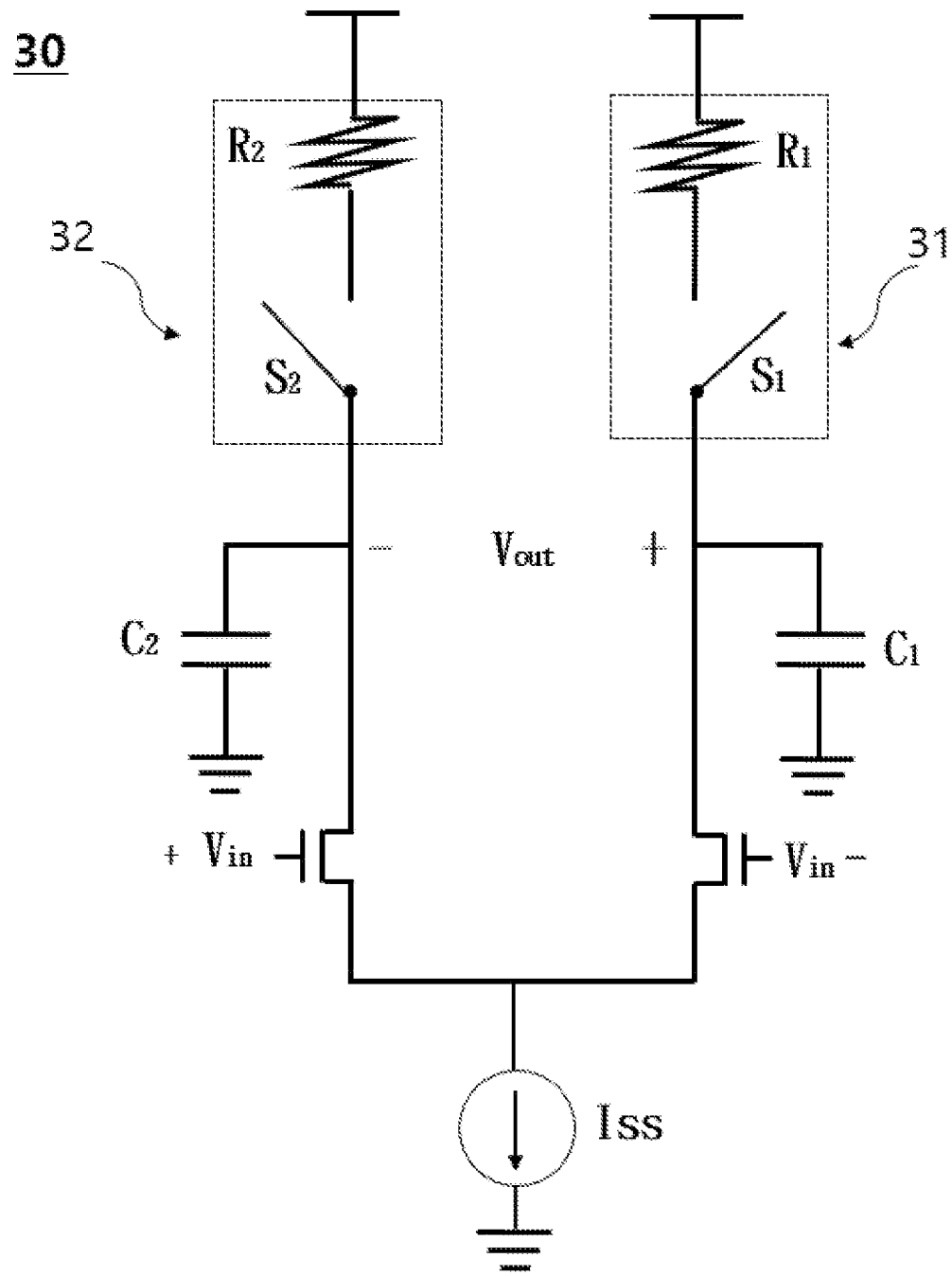
FIG. 5 is a diagram illustrating a circuit diagram of a current mode logic circuit according to the related art.
Figure 6:
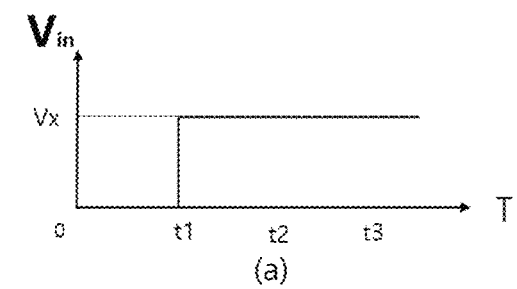
FIG. 6 is a diagram illustrating magnitudes of an input voltage and an output voltage of the current mode logic circuit according to FIG. 5
Figure 6:
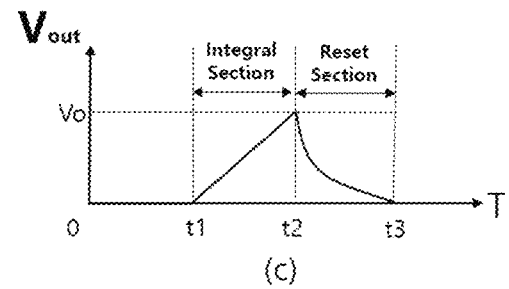
Figure 6:
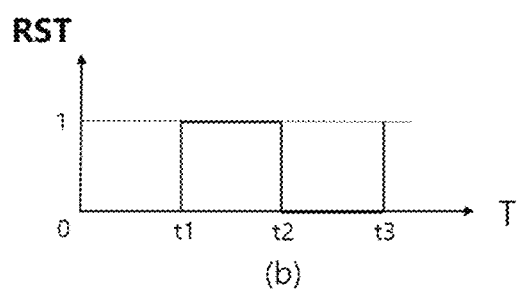

FIG. 3 is a diagram illustrating a circuit diagram of a current mode logic circuit according to the prior art, and FIG. 4 is a diagram illustrating magnitudes of an input voltage and an output voltage of the current mode logic circuit according to FIG. 3, and FIG. 5 is a diagram illustrating a circuit diagram of a current mode logic circuit according to the related art, and FIG. 6 is a diagram illustrating magnitudes of an input voltage and an output voltage of the current mode logic circuit according to FIG. 5

The circuit according to FIG. 3 is a current mode logic circuit 20 using a passive inductor. The circuit according to FIG. 3 uses the resonance phenomenon of the inductors (L1, L2 inductors) and the load capacitances (C1, C2 Load capacitors) to peak the gain at a specific frequency. The current mode logic circuit 20 according to FIG. 3 operates as if the circuit is open by using the characteristics of the inductor L1, so that the current flows through the capacitance C1 without flowing through the resistor. Therefore, when the input voltage is input as shown in FIG. 4(a), the output voltage is output as shown in FIG. 4(b), so there is an advantage in that the circuit can be operated at a relatively high speed.

However, in the current mode logic circuit 20 of this type, as shown in FIG. 3 the area of the passive inductor Lp is 20 times larger than that of the active inductor. In addition, there is a problem in that the operating speed of the circuit is lowered due to the additional parasitic capacitance Cp generated by the inductor L1.

Also, although not shown in the drawings, an active inductor current mode logic circuit having the same characteristics as those of the inductor has been proposed using a resistor and a transistor similar to the circuit of FIG. 3. However, these circuits also have problems with linearity and sensitivity to changes in process, voltage and temperature (PVT).

Therefore, the current mode logic circuit according to the prior art has a problem of increasing the complexity of the circuit because an additional configuration must be installed in the circuit to solve these problems. In addition, since the inductor is implemented using a resistor and a transistor, the output voltage of the circuit is reduced, which causes a problem in that the inductor is sensitive to noise.

Accordingly, in order to improve this problem, as shown in FIG. 5 a current mode logic circuit 30 using an integration-reset unit 31 has been proposed.

When the input voltage is input as shown in FIG. 6(a) and the reset switch is operated as shown in FIG. 6(b), the current mode logic circuit 30 is not affected by the time constant. Accordingly, as shown in FIG. 6(c), a linear voltage may be output in the period t1 to t2. Accordingly, it is possible to easily control the speed while operating the circuit at high speed, and since an inductor is not required, the circuit can be implemented with a relatively small area.

However, the current mode logic circuit 30 according to FIG. 5 has a problem in that the integrator needs to be periodically reset. In addition, since an additional parasitic capacitance (not shown) is generated due to the reset switch circuits 31 and 32, there is a problem in that the speed of the circuit is reduced.

In addition, when the reset operation is operated as shown in FIG. 6(c), there is a problem that the time constant of the RC circuit including the reset switch and the load capacitance in the period t2 to t3 lowers the maximum speed of the circuit.

Accordingly, there is a demand for a current mode logic circuit that solves the problems of the conventional current mode logic circuit. Hereinafter, a current mode logic circuit 100 according to an embodiment that has solved the problems of the prior art will be described with reference to the drawings.

Figure 7:
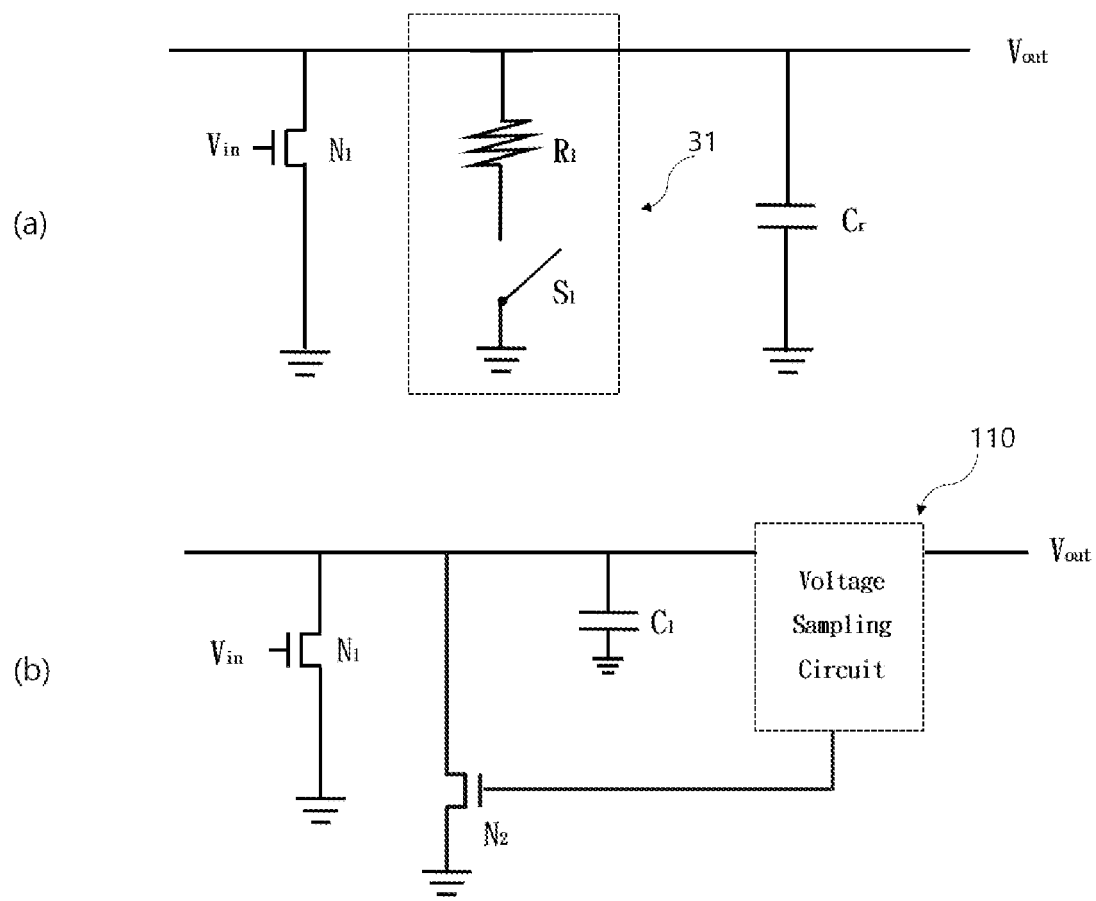
FIG. 7 is a diagram comparing a current mode logic circuit according to the prior art and a current mode logic circuit according to an embodiment.

FIG. 6 is a diagram illustrating magnitudes of an input voltage and an output voltage of the current mode logic circuit according to FIG. 5, and FIG. 7 is a diagram comparing a current mode logic circuit according to the prior art and a current mode logic circuit according to an embodiment. Specifically, FIG. 7(a) is a diagram illustrating a half circuit of a circuit using the integration-reset method according to FIG. 6, and FIG. 7(b) is a current mode logic circuit 100 is a diagram showing a half circuit.

Figure 8:
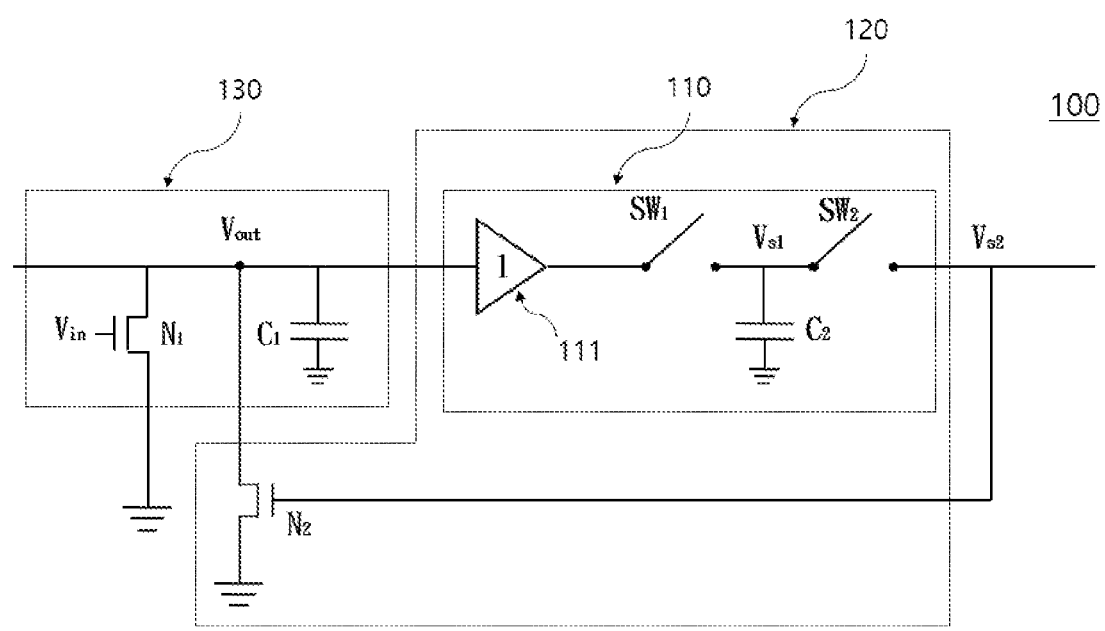
FIG. 8 is a diagram illustrating some of the components of a current mode logic circuit according to an embodiment.

Referring to FIG. 8 the current mode logic circuit 100 according to an embodiment may include an integration circuit 130 and a self-compensation circuit 120. In more detail, the integration circuit 130 may include a first transistor N1 and a first capacitance C1 that perform integration with respect to the input power Vin according to time. The first transistor N1 and the first capacitance C1 are connected to the input voltage.

The self-compensation circuit 130 may include a voltage sampling circuit 110 and a second transistor N2 connected to an output terminal of the voltage sampling circuit 110. The voltage sampling circuit 110 may perform a reset function of a circuit performed by the reset switch 31 in a conventional integral-reset current mode logic circuit.

As shown in FIG. 8, the voltage sampling circuit 110 may include a first switch SW1, a second switch SW2, and a second capacitance C2, which may serve as a sampling function. The second capacitance C2 is disposed between the first switch SW1 and the second switch SW2 and may be connected to the ground.

Although FIG. 8 illustrates that the voltage sampling circuit 110 includes a buffer 111 for amplifying a voltage, the configuration of the voltage sampling circuit 100 according to the present invention is not limited thereto. Depending on the purpose of use, the voltage sampling circuit 110 may configure the voltage sampling circuit 110 in which the buffer 111 is omitted.

In the case of the circuit according to the prior art, the circuit is reset by connecting the reset switch 31 to the ground. However, the voltage sampling circuit 110 according to an exemplary embodiment may implement a reset operation of the circuit (self-compensation) by integrating the input voltage in a direction opposite to the integration signal after the integration period is completed. This will be described in detail with reference to FIGS. 9 and 10.

Figure 9:
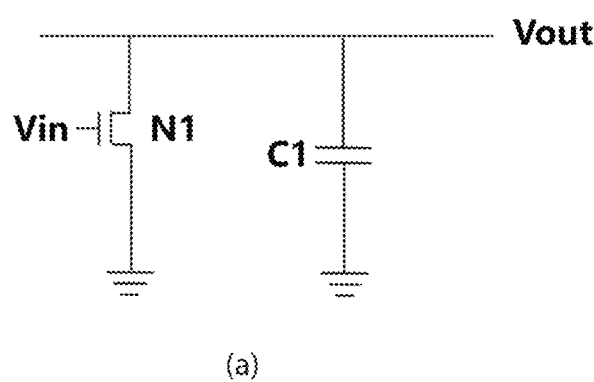
FIGS. 9 and 10 are diagrams for explaining an operating principle of self-compensating integration of a current mode logic circuit according to an exemplary embodiment.
Figure 9:
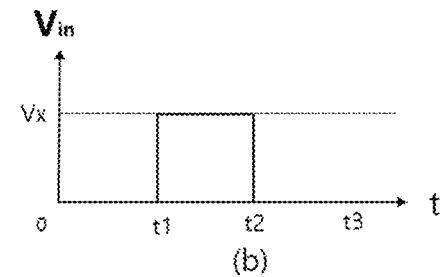
Figure 9:
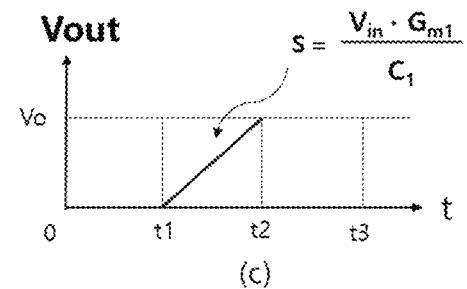
Figure 10:
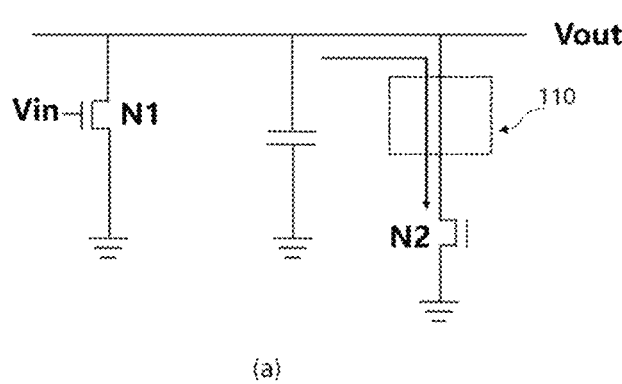
Figure 10:
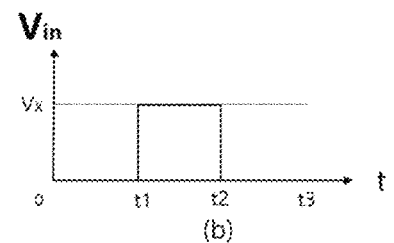
Figure 10:
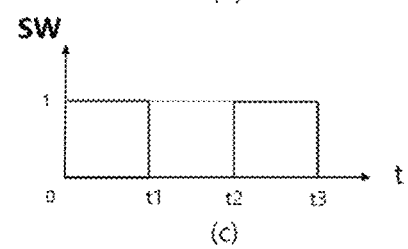
Figure 10:
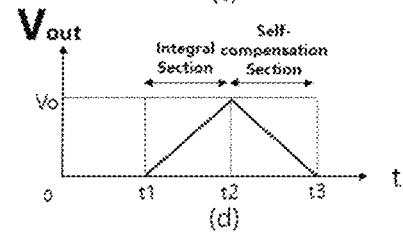

FIGS. 9 and 10 are diagrams for explaining an operating principle of self-compensating integration of a current mode logic circuit according to an exemplary embodiment.

Referring to FIG. 9, when the input power is connected to the first transistor N1 as shown in FIG. 9(a), and the input voltage is input as shown in FIG. 9(c), time t1 The voltage output(Vout) from t1~t2 is output in proportion to time as shown in FIG. 9(c). And when the voltage-current gain of the first transistor N1 is Gm1, the slope S of the output voltage with time may be expressed as Equation (1) below.

$$S = \frac{V_{in} \cdot G_{m1}}{C_1} \qquad \text{Equation (1)}$$

Although it is shown that the voltage increases in the positive direction in FIG. 9(a), it is drawn in the positive direction for convenience. The voltage may be shown to increase in a negative direction depending on which point the reference of the voltage is set. When the voltage is shown in the negative direction, the direction of the voltage and the current is only shown in the opposite direction, and the practical principle of operation is the same.

After integration is performed according to the input voltage, when the switch of the voltage sampling circuit 110 is turned on in the period t2 to t3 as shown in FIG. 10(b). Accordingly, since the current charged in the capacitance C1 flows, the output voltage Vout decreases linearly as shown in FIG. 10(c).

Figure 11:
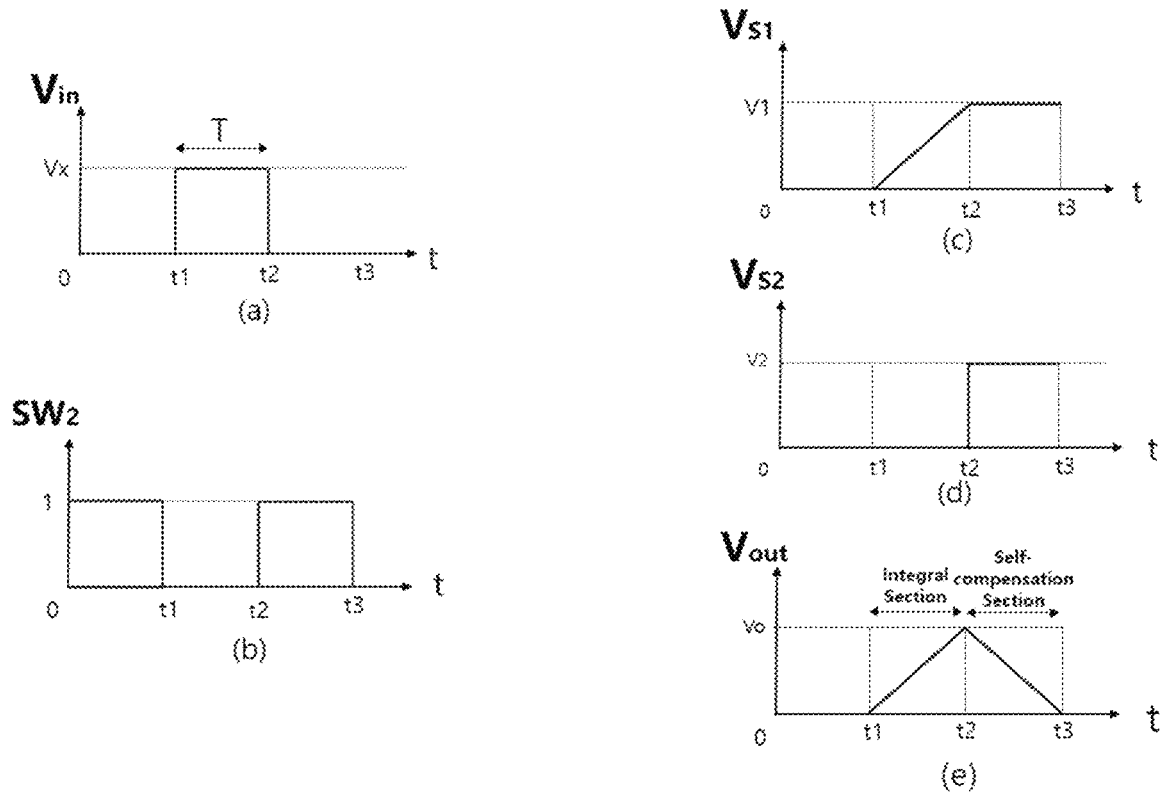
FIG. 11 is a diagram illustrating a voltage input to a current mode logic circuit and an output voltage corresponding thereto according to an exemplary embodiment.

FIG. 11 is a diagram illustrating a voltage input to a current mode logic circuit and an output voltage corresponding thereto according to an exemplary embodiment. Specifically, FIG. 11(a) shows a waveform of the input power, and FIG. 11(b) shows an ON/OFF waveform of a clock serving as a switch. FIG. 11(c) shows the voltage at the point S1, FIG. 11(d) shows the voltage at the point S2, and FIG. 11(e) shows the waveform of the output voltage of the current mode logic circuit.

If the input voltage is input as shown in FIG. 11(a) and the second switch SW2 is operated as shown in FIG. 11(b), Vs1, Vs2 and Vout are respectively shown in FIGS. 11(c), (d), and (e) can be output as shown.

Here, assuming that the gain of the first transistor M1 is Gm1 and the gain of the second transistor M2 is Gm2, the maximum output voltage Vo can be calculated as shown in Equation (2) below.

$$V_O = \frac{V_X \cdot G_{m1} \cdot T}{C_1} \qquad \text{Equation (2)}$$

And if the switch is OFF at t2, Vout is output as the voltage of VS2. Accordingly, in this case, the voltage V2 of t2 to t3 at the point VS2 may be expressed as Equation (3) below.

$$V_2 = \frac{V_X \cdot G_{m1} \cdot T}{C_1} \qquad \text{Equation (3)}$$

Since the voltage V2 at the point VS2 is connected to the input voltage of the second transistor M2, the output voltage of the second transistor M2 becomes Vout=V2*(Gm2*T)/CL. And if these output voltages match Vo at t2, the same full compensation as the reset effect can be achieved.

That is, if Equation (4) below is satisfied, it corresponds to a condition for full compensation, and if Equation (4) is arranged, the final condition for full compensation as Equation (5) below can be calculated.

$$\frac{V_X \cdot G_{m1} \cdot T}{C_1} = \frac{V_X \cdot G_{m1} \cdot T}{C_1} \cdot \frac{G_{m2} \cdot T}{C_1} \qquad \text{Equation (4)}$$

$$1 = \frac{G_{m2} \cdot T}{C_1} \qquad \text{Equation (5)}$$

Figure 12:
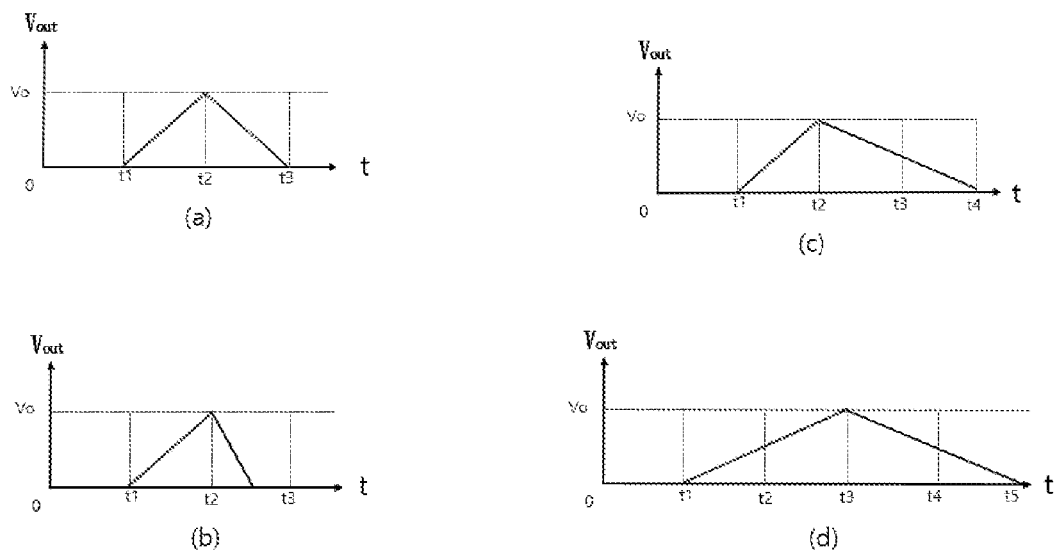
FIG. 12 is a diagram illustrating waveforms of various voltages that may be output from a current mode logic circuit according to an exemplary embodiment.

FIG. 12 is a diagram illustrating waveforms of various voltages that may be output from a current mode logic circuit according to an exemplary embodiment.

The current mode logic circuit 100 according to the present invention may adjust the self-compensated integration time by individually adjusting the On/Off of the first switch SW1 and the second switch SW2. Specifically, it may be reduced as shown in FIG. 12(b) or may be increased as shown in FIG. 12(c), and both the increase time and the decrease time of the input voltage may be increased as shown in FIG. 12(d).

The waveform of the output voltage shown in FIG. 12 is an example, and the embodiment of the present invention is not limited thereto, and the time ratio of the integration period and the self-compensation period may be variously changed according to the purpose of use of the circuit.

Figure 13:
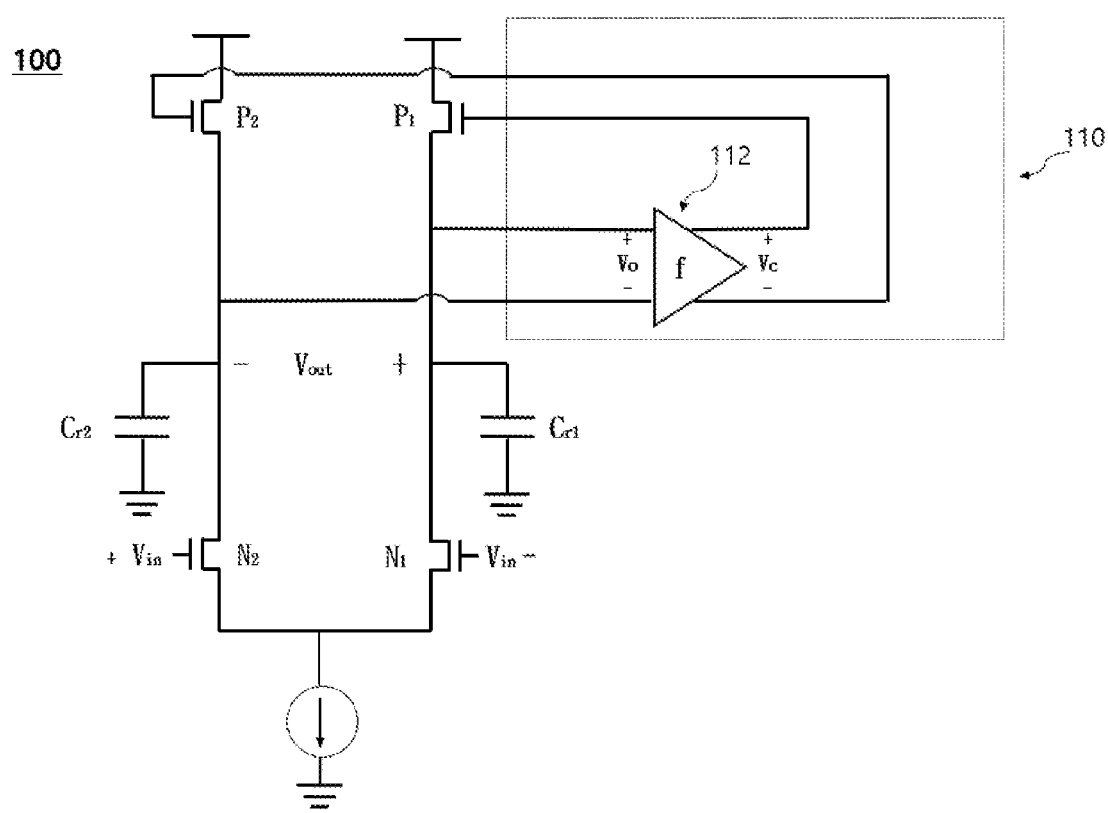
FIG. 13 is a diagram illustrating some components of a current mode logic circuit according to another embodiment.
Figure 14:
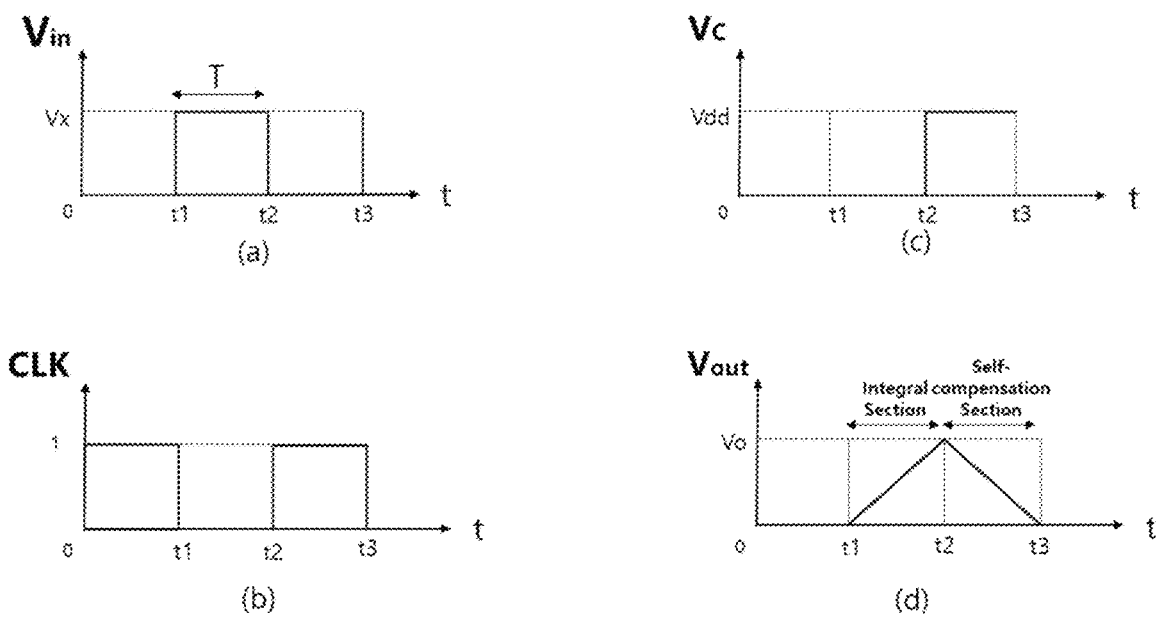
FIG. 14 is a diagram illustrating a voltage input to a current mode logic circuit and an output voltage corresponding thereto, according to another exemplary embodiment.

FIG. 13 is a diagram illustrating some components of a current mode logic circuit according to another embodiment, and FIG. 14 is a diagram illustrating a voltage input to a current mode logic circuit and an output voltage corresponding thereto, according to another exemplary embodiment. Specifically, FIG. 14(a) is a diagram illustrating a waveform of an input power, and FIG. 14(b) is a diagram illustrating a waveform of a clock comparator serving as a switch. FIG. 14(c) is a diagram illustrating a voltage at point C, and FIG. 14(d) is a diagram illustrating a waveform of an output voltage.

The configuration of the self-compensation circuit of FIG. 13 is different from the configuration of the self-compensation circuit of FIG. 8, but the principle of operation is substantially the same.

Referring to FIG. 13, the voltage sampling circuit may include a clock comparator 112 and a plurality of transistors P1 and P2 connected to the clock comparator 112. Specifically, the voltage sampling circuit 110 is respectively connected to the (+) voltage and the (−) voltage of Vout as shown in FIG. 13, and the output voltage of the clock comparator 112 is the third transistor P3 and It is connected to the fourth transistor P4. In addition, the third transistor P3 and the fourth transistor P4 may be formed of PMOS, and the first transistor N1 and the second transistor N2 may be formed of NMOS.

If the input voltage is input as shown in FIG. 13(a) and the waveform of the clock comparator 112 is operated as shown in FIG. 13(b), the voltages Vc and Vout may be output as shown in FIGS. 13(c) and 13(d). And when the voltage Vdd in FIG. 13(c) and the voltage Vo in FIG. 14(d) are the same, complete compensation may be performed as described in FIG. 10.

Therefore, when Equation (6) is satisfied, the full compensation condition is satisfied, and by rearranging Equation (6), the full compensation condition as Equation (7) below can be calculated.

$$\frac{V_X \cdot G_{m1} \cdot T}{C_1} = V_{dd} \cdot \frac{G_{m2} \cdot T}{C_1} \qquad \text{Equation (6)}$$

$$V_X \cdot G_{m1} = V_{dd} \cdot G_{m2} \qquad \text{Equation (7)}$$

Figure 15:
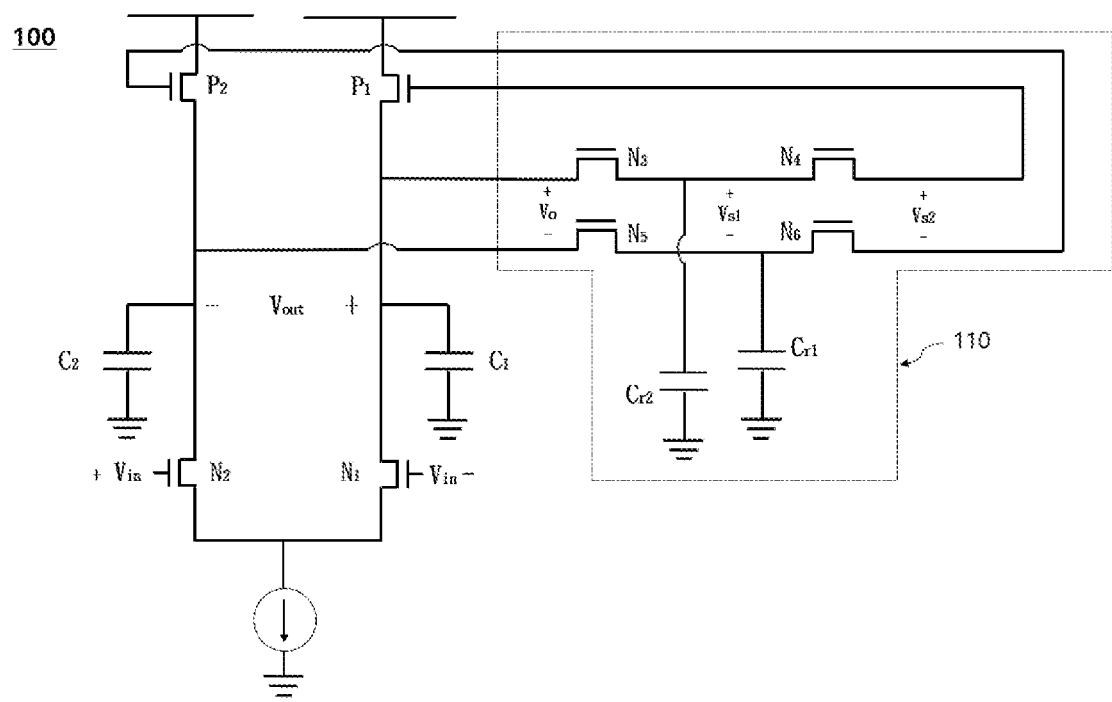
FIG. 15 is a circuit diagram illustrating a partial configuration of a current mode logic circuit according to another embodiment.

FIG. 15 is a circuit diagram illustrating a partial configuration of a current mode logic circuit according to another embodiment. The voltage sampling circuit according to FIG. 15 includes four transistors (N5, N6, N7, N8) and two capacitances (C3, C4), and includes four transistors (N5, N6, N7, N8) and two capacitances. (C3, C4) may serve as a self-compensation circuit. Accordingly, it is possible to perform a function similar to that of the circuit of FIG. 8 as a whole.

Figure 16:
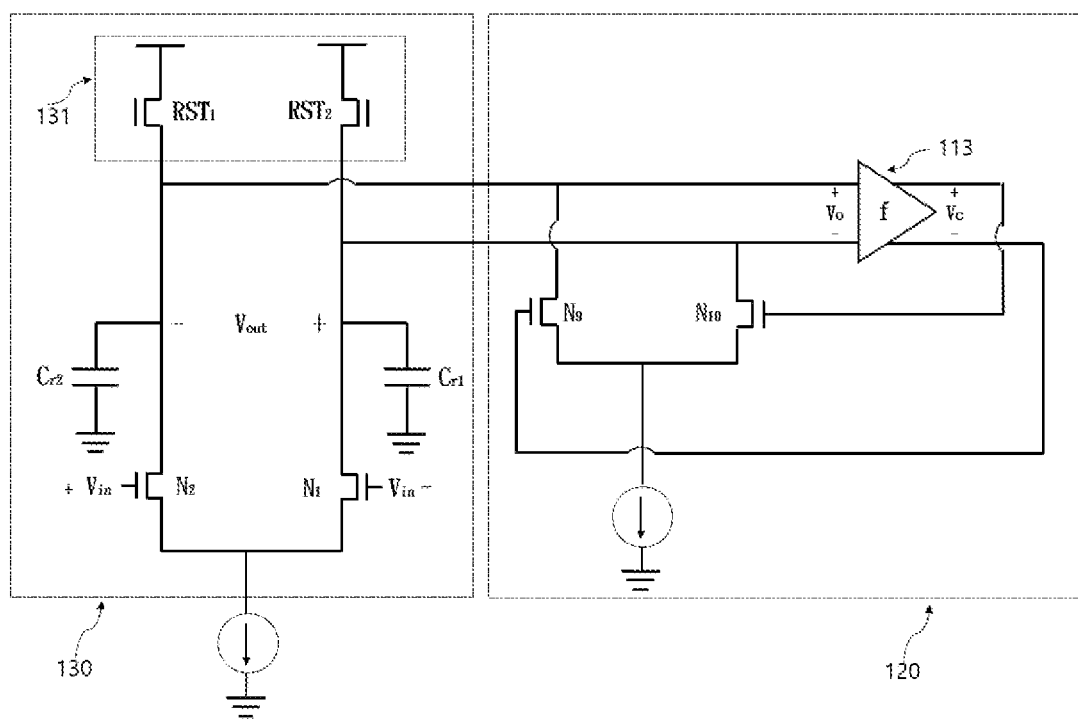
FIG. 16 is a circuit diagram illustrating a partial configuration of a current mode logic circuit according to another embodiment.

FIG. 16 is a circuit diagram illustrating a partial configuration of a current mode logic circuit according to another embodiment.

The circuit of FIG. 16 is a circuit in which the conventional current mode logic circuit 30 and the current mode logic circuit 100 according to an embodiment are connected to each other. When the circuit is configured as shown in FIG. 16, there is an advantage in that the RC time constant problem of the reset circuit of the conventional circuit can be alleviated.

So far, a current mode logic circuit according to the embodiment have been described in detail.

The current mode logic circuit according to an embodiment does not implement the reset operation using a switch, but implements the reset operation by integrating in a direction opposite to the integration signal in the reset period. Accordingly, the present invention has the advantage of solving the time constant problem of the RC circuit related to the reset operation of the conventional current mode logic circuit.

In addition, the present invention does not require a separate reset circuit for resetting the circuit, so that an increase in parasitic capacitance caused by the reset circuit can be minimized. Accordingly, the present invention has the advantage of having a faster operation speed with a smaller size than the current mode logic circuit according to the prior art.

On the other hand, the constitutional elements, units, modules, components, and the like stated as "~part or portion" in the present invention may be implemented together or individually as logic devices interoperable while being individual. Descriptions of different features of modules, units or the like are intended to emphasize functional embodiments different from each other and do not necessarily mean that the embodiments should be realized by individual hardware or software components. Rather, the functions related to one or more modules or units may be performed by individual hardware or software components or integrated in common or individual hardware or software components.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment.

Additionally, the logic flows and structure block diagrams described in this patent document, which describe particular methods and/or corresponding acts in support of steps and corresponding functions in support of disclosed structural means, may also be utilized to implement corresponding software structures and algorithms, and equivalents thereof.

The processes and logic flows described in this specification can be performed by one or more programmable processors executing one or more computer programs to perform functions by operating on input data and generating output.

This written description sets forth the best mode of the present invention and provides examples to describe the present invention and to enable a person of ordinary skill in the art to make and use the present invention. This written description does not limit the present invention to the specific terms set forth.

While the present invention has been shown and described with reference to certain embodiments thereof, it will be understood by those skilled in the art that various changes in forms and details may be made therein without departing from the spirit and scope of the present invention as defined by the appended claims and their equivalents. Therefore, the technical scope of the present invention may be determined by on the technical scope of the accompanying claims.

The current mode logic circuit in accordance with one embodiment can stably drive a transistor unlike the prior art even if the drive voltage of the circuit is increased, and thus, has an advantage of being able to widen the output swing width of the circuit. Accordingly, there is an effect of being able to improve the output signal and the signal-to-noise ratio (SNR) of the current mode logic circuit, thereby reducing the influence of noise and interference.

What is claimed is:

1. A current mode logic circuit comprising:
a first transistor to which an input voltage is applied;
a second transistor connected in parallel with the first transistor; and
a voltage sampling circuit which is connected to the first transistor and the second transistor and resets an output voltage output by integrating the input voltage for a predetermined set time (T) in a manner in which the output voltage is integrated in a direction opposite to a direction in which the input voltage is integrated for the predetermined set time (T),
wherein:
the voltage sampling circuit includes a first switch, a second switch, a first capacitor, and a second capacitor;
the first switch is connected to one end of the second transistor;
the second switch is connected to the other end of the second transistor; and
the second capacitor is disposed between the first switch and the second switch.

2. The current mode logic circuit of claim 1, wherein the voltage sampling circuit individually controls the first switch and the second switch to be turned on or off so that, for an output form of the output voltage, a section in which the input voltage is integrated and output and a section in which the output voltage is reset are alternated at a certain period.

3. The current mode logic circuit of claim 2, wherein:
when the first switch is turned on and the second switch is turned off, the output voltage is a voltage integrated by the input voltage; and
when the first switch is turned off and the second switch is turned on, the output voltage is a voltage generated in a process of resetting the output voltage output by integrating the input voltage.

4. The current mode logic circuit of claim 2, wherein the voltage sampling circuit individually controls the first switch and the second switch to be turned on or off so that a length of the section in which the input voltage is integrated and output as the output voltage is the same as a length of the section in which the output voltage is reset.

5. The current mode logic circuit of claim 2, wherein the voltage sampling circuit individually controls the first switch and the second switch to be turned on or off so that a length of the section in which the input voltage is integrated and output as the output voltage is different from a length of the section in which the output voltage is reset.

6. The current mode logic circuit of claim 2, wherein the voltage sampling circuit controls the predetermined set time (T) so that a product of a transconductance (GM2) of the second transistor and the predetermined set time (T) is the same as a capacitance (C1) of the first capacitor.

7. The current mode logic circuit of claim 2, further comprising a buffer connected to the first switch to amplify an output voltage of the current mode logic circuit.

8. A current mode logic circuit comprising:
an integrating circuit which includes a first transistor to which an input voltage is applied and a first capacitor connected in parallel with the first transistor and integrates the input voltage for a predetermined set time to output an output voltage; and
a self-compensation circuit which resets the output voltage output by the integrating circuit in a manner in which the input voltage is integrated in a direction opposite to a direction in which the input voltage is integrated for the predetermined set time in the integrating circuit,
wherein:
the self-compensation circuit includes a voltage sampling circuit and a second transistor; and
the predetermined set time (T) is controlled so that a product of a transconductance (GM2) of the second transistor and the predetermined set time is the same as a capacitance (C1) of the first capacitor.

9. The current mode logic circuit of claim 8, wherein:
the integrating circuit includes a third transistor and a fourth transistor;
the self-compensation circuit includes a clock comparator;
the output voltage of the integrating circuit is input as an input voltage of the clock comparator; and
an output voltage of the clock comparator is applied to the third transistor and the fourth transistor.

10. The current mode logic circuit of claim 8, wherein:
the integrating circuit includes a third transistor and a fourth transistor; and
the self-compensation circuit includes a fifth transistor and a sixth transistor connected in series, a seventh transistor and an eighth transistor connected in series, a third capacitor connected between the fifth transistor and the sixth transistor, and a fourth capacitor connected between the seventh transistor and the eighth transistor.

11. The current mode logic circuit of claim 10, wherein:
the output voltage of the integrating circuit is input to the fifth transistor and the seventh transistor; and
an output voltage of the self-compensation circuit is input to the third transistor and the fourth transistor.

* * * * *